United States Patent
Menezes et al.

(10) Patent No.: US 8,541,053 B2
(45) Date of Patent: Sep. 24, 2013

(54) ENHANCED DENSIFICATION OF SILICON OXIDE LAYERS

(75) Inventors: Marlon Menezes, Austin, TX (US);
Frank Y. Xu, Round Rock, TX (US);
Fen Wan, Austin, TX (US)

(73) Assignee: Molecular Imprints, Inc., Austin, TX (US)

(*) Notice: Subject to any disclaimer, the term of this patent is extended or adjusted under 35 U.S.C. 154(b) by 97 days.

(21) Appl. No.: 13/178,057

(22) Filed: Jul. 7, 2011

(65) Prior Publication Data

US 2012/0009413 A1 Jan. 12, 2012

Related U.S. Application Data

(60) Provisional application No. 61/362,573, filed on Jul. 8, 2010.

(51) Int. Cl.
*B05D 3/02* (2006.01)
*B05D 3/04* (2006.01)
*B32B 3/26* (2006.01)

(52) U.S. Cl.
USPC . 427/240; 427/243; 427/255.11; 427/255.18; 427/336; 427/337; 427/377; 427/419.7

(58) Field of Classification Search
USPC ............... 427/243, 240, 377, 255.11, 255.18, 427/336, 337, 419.7; 428/304.4; 438/692, 438/780
See application file for complete search history.

(56) References Cited

U.S. PATENT DOCUMENTS

| | | | |
|---|---|---|---|
| 3,850,687 A | 11/1974 | Kern | |
| 4,686,112 A * | 8/1987 | Hoffman | 427/567 |
| 6,326,287 B1 * | 12/2001 | Asahina et al. | 438/584 |
| 6,873,087 B1 | 3/2005 | Choi et al. | |
| 6,932,934 B2 | 8/2005 | Choi et al. | |
| 6,936,194 B2 | 8/2005 | Watts | |
| 7,077,992 B2 | 7/2006 | Sreenivasan et al. | |
| 7,157,036 B2 | 1/2007 | Choi et al. | |
| 7,179,396 B2 | 2/2007 | Sreenivasan | |
| 7,396,475 B2 | 7/2008 | Sreenivasan | |
| 7,521,378 B2 | 4/2009 | Fucsko et al. | |
| 7,655,532 B1 * | 2/2010 | Chen et al. | 438/424 |
| 7,790,633 B1 * | 9/2010 | Tarafdar et al. | 438/788 |
| 2004/0065252 A1 | 4/2004 | Sreenivasan et al. | |
| 2004/0065976 A1 | 4/2004 | Sreenivasan et al. | |
| 2005/0187339 A1 | 8/2005 | Xu et al. | |
| 2007/0259106 A1 | 11/2007 | Shimizu et al. | |
| 2009/0140458 A1 | 6/2009 | Xu et al. | |
| 2010/0084376 A1 | 4/2010 | Khusnatdinov et al. | |

(Continued)

FOREIGN PATENT DOCUMENTS

WO WO/2010/063504 A2 6/2010

*Primary Examiner* — Kirsten Jolley
(74) *Attorney, Agent, or Firm* — Cameron A. King

(57) ABSTRACT

Densifying a multi-layer substrate includes providing a substrate with a first dielectric layer on a surface of the substrate. The first dielectric layer includes a multiplicity of pores. Water is introduced into the pores of the first dielectric layer to form a water-containing dielectric layer. A second dielectric layer is provided on the surface of the water-containing first dielectric layer. The first and second dielectric layers are annealed at temperature of 600° C. or less. In an example, the multi-layer substrate is a nanoimprint lithography template. The second dielectric layer may have a density and therefore an etch rate similar to that of thermal oxide, yet may still be porous enough to allow more rapid diffusion of helium than a thermal oxide layer.

18 Claims, 4 Drawing Sheets

(56) References Cited

U.S. PATENT DOCUMENTS

2010/0104852 A1    4/2010   Fletcher et al.
2010/0109201 A1    5/2010   Fletcher et al.
2010/0203673 A1*   8/2010   Hayashi et al. ............... 438/104

* cited by examiner

ENHANCED DENSIFICATION OF SILICON OXIDE LAYERS

CROSS-REFERENCE TO RELATED APPLICATION

This application claims priority to U.S. Provisional Application Ser. No. 61/362,573, filed Jul. 8, 2010, which is incorporated by reference herein.

TECHNICAL FIELD

This invention relates to enhanced densification and/or improved quality of silicon oxide layers in a variety of applications, including nanoimprint lithography.

BACKGROUND

Processing methods including forming dielectric layers for electrical isolation in integrated circuits have been described. One example is thermal oxidation of silicon in a wet or dry oxidation process at a temperature between 800° C. and 1200° C. to form silicon dioxide, in which water vapor (steam) or molecular oxygen, respectively, is used as the oxidant or catalyst. Wet or dry thermal oxidation of silicon can yield a pure, high-quality, amorphous oxide, with a density of 2.2 g/cm$^3$. However, the high temperatures used in thermal oxidation can make this process unsuitable for certain applications. In addition, costs associated with high-temperature processes can be prohibitive.

Processes to form silicon dioxide layers at lower temperatures have been described. For example, U.S. Pat. No. 3,850,687 to Wern, which is incorporated by reference herein, describes densification of a silicate glass that has been deposited on a substrate as a layer from the vapor phase. Densification of the silicate glass includes heating the glass layer at a temperature on the order of about 400° C. to 450° C. in an atmosphere of water vapor. In "Silicon Nitride and Silicon Dioxide Thin Insulating Films: Proceedings of the Symposium on Silicon Nitride and Silicon Dioxide Thin Insulating Films" by M. J. Deen, which is incorporated by reference herein, annealing chemical vapor deposited silicon dioxide films in the range of 250° C. to 400° C. in a steam ambient was shown to improve stress stability of the silicon dioxide films. U.S. Pat. No. 7,521,378 to Fucsko et al., which is incorporated by reference herein, describes a low temperature process for polysilazane oxidation/densification. The process includes depositing a polysilazane solution on a substrate and processing with ozone in a wet oxidation at a temperature less than about 100° C. to chemically modify the polysilazane material to a silicon oxide layer. These silicon oxide layers, however, lack some of the desirable physical properties of more dense silicon oxide layers formed by thermal oxidation.

Nanofabrication includes the fabrication of very small structures that have features on the order of 100 nanometers or smaller. One application in which nanofabrication has had a sizeable impact is in the processing of integrated circuits. The semiconductor processing industry continues to strive for larger production yields while increasing the circuits per unit area formed on a substrate, therefore nanofabrication becomes increasingly important. Nanofabrication provides greater process control while allowing continued reduction of the minimum feature dimensions of the structures formed. Other areas of development in which nanofabrication has been employed include biotechnology, optical technology, mechanical systems, and the like.

SUMMARY

In general, one innovative aspect of the subject matter described in this specification can be embodied in methods including providing a substrate with a first dielectric layer defining a multiplicity of water-containing pores, providing a second dielectric layer on the water-containing first dielectric layer, and steam annealing the first and second dielectric layers at a temperature of 600° C. or less. The density of the second dielectric layer increases during the steam annealing. Another innovative aspect of the subject matter includes a device fabricated by the process described above. Another innovative aspect of the subject matter includes forming a nanoimprint lithography template including a porous layer and a densified cap layer on fused silica by the process described above.

These and other embodiments can each optionally include one or more of the following features. In some cases, the substrate is substantially impermeable to water. Providing the substrate with the first dielectric layer may include forming the first dielectric layer on the substrate and contacting the first dielectric layer with a fluid including water. Forming the first dielectric layer on the substrate can include a spin coating process or a chemical vapor deposition process. Before annealing, the first dielectric layer may include SiO$_x$, with x≠2, and/or a silicon-containing polymer. The fluid can be a vapor or a liquid. Contacting the first dielectric layer with a fluid including water can include chemical mechanical planarization of the first dielectric layer, contacting the first dielectric layer with an aqueous solution or water, and soaking or dipping the first dielectric layer in an aqueous solution or in water. Providing a second dielectric layer on the water-containing first dielectric layer can include a chemical vapor deposition process or a spin coating process. When providing the second dielectric layer on the surface of the first dielectric layer includes a spin coating process, the spin coating process can include spin coating a polymerizable material (e.g., a polysilazane film or a spin-on-glass film) on the water-containing first dielectric layer. The polymerizable material may be patterned and/or pre-baked to form a patterned second dielectric layer or cap layer. After annealing, a ratio of an etch rate of the second dielectric layer to an etch rate of thermal oxide can be in a range between 1:1 and 1.25:1 or in a range between 1:1 and 1.1:1. The density of the first dielectric layer may increase during the annealing process, substantially simultaneously with an increase in density of the second dielectric layer.

Advantages of the methods and devices described herein include enhanced densification of a silicon oxide layer to achieve thermal-oxide-like (SiO$_2$-like) properties at lower processing temperatures. The thermal-oxide-like properties may be apparent, for example, as a density comparable to a density of thermal oxide, an etch rate comparable to an etch rate of thermal oxide, and the like.

The details of one or more embodiments of the subject matter described in this specification are set forth in the accompanying drawings and the description below. Other features, aspects, and advantages of the subject matter will become apparent from the description, the drawings, and the claims.

DETAILED DESCRIPTION

An exemplary nanofabrication technique in use today is commonly referred to as imprint lithography. Exemplary imprint lithography processes are described in detail in numerous publications, such as U.S. Patent Application Publication No. 2004/0065976, U.S. Patent Application Publication No. 2004/0065252, and U.S. Pat. No. 6,936,194, all of which are hereby incorporated by reference herein.

An imprint lithography technique disclosed in each of the aforementioned U.S. patent application publications and patent includes formation of a relief pattern in a formable (polymerizable) layer and transferring a pattern corresponding to the relief pattern into an underlying substrate. The substrate may be coupled to a motion stage to facilitate positioning for the patterning process. The patterning process uses a template spaced apart from the substrate and the formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

Figure 1:
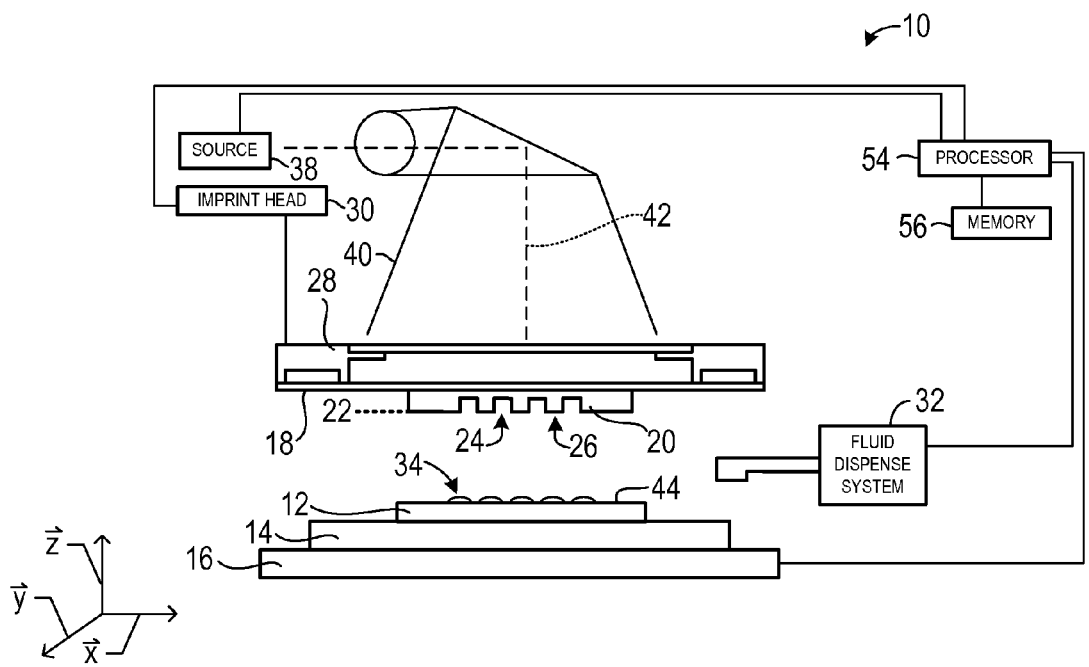
FIG. 1 illustrates a simplified side view of a lithographic system.

Referring to FIG. 1, illustrated therein is a lithographic system 10 used to form a relief pattern on substrate 12. An imprint lithography stack may include substrate 12 and one or more layers (e.g., an adhesion layer) adhered to the substrate. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and the like, or any combination thereof. Exemplary chucks are described in U.S. Pat. No. 6,873,087, which is hereby incorporated by reference herein.

Substrate 12 and substrate chuck 14 may be further supported by stage 16. Stage 16 may provide motion about the x-, y-, and z-axes. Stage 16, substrate 12, and substrate chuck 14 may also be positioned on a base (not shown).

Spaced-apart from substrate 12 is a template 18. Template 18 may include a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, silazane polymers, borosilicate glass, fluorocarbon polymers, metal, hardened sapphire, and the like, or any combination thereof. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and the like, or any combination thereof. Polymerizable material 34 (e.g., imprint resist) may be disposed upon substrate 12 before and/or after a desired volume is defined between mold 20 and substrate 12 depending on design considerations. Polymerizable material 34 may include components as described in U.S. Pat. No. 7,157,036 and U.S. Patent Application Publication No. 2005/0187339, both of which are hereby incorporated by reference herein.

Figure 2:
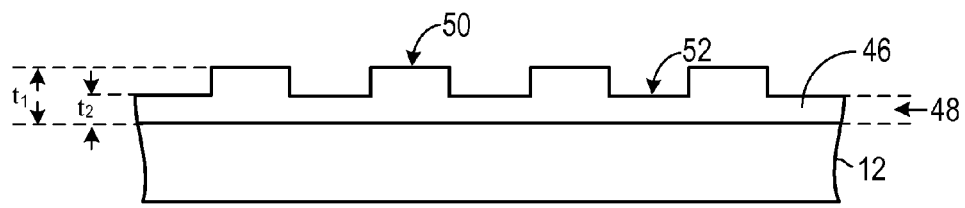
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, source 38, or any combination thereof, and may operate on a computer readable program stored in memory 56.

Either imprint head 30, stage 16, or both may alter a distance between mold 20 and substrate 12 to define a desired volume therebetween that is substantially filled by polymerizable material 34. For example, imprint head 30 may apply a force to template 18 such that mold 20 contacts polymerizable material 34. After the desired volume is substantially filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may include a residual layer 48 and a plurality of features shown as protrusions 50 and recessions 52, with protrusions 50 having a thickness $t_1$ and residual layer 48 having a thickness $t_2$.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, each of which is hereby incorporated by reference herein.

In nanoimprint processes in which polymerizable material is applied to a substrate by drop dispense or spin coating methods, gases may be trapped inside recesses in the template after the template contacts the polymerizable material. In nanoimprint processes in which polymerizable material is applied to a substrate by drop dispense methods, gases may also be trapped between drops of polymerizable material or imprint resist dispensed on a substrate or on an imprinting stack. That is, gases may be trapped in interstitial regions between drops as the drops spread.

Gas escape and dissolution rates may limit the rate at which the polymerizable material is able to form a continuous layer on the substrate (or imprinting stack) or the rate at which the polymerizable material is able to fill template features after the template contacts the polymerizable material, thereby limiting throughput in nanoimprint processes. For example, a substrate or a template may be substantially impermeable to a gas trapped between the substrate and the template. In some cases, a polymeric layer adhered to the substrate or the template may become saturated with gas, such that gas between the imprinting stack and the template is substantially unable to enter the saturated polymeric layer, and remains trapped between the substrate and the substrate or imprinting stack. Gas that remains trapped between the substrate or the imprinting stack and the template may cause filling defects in the patterned layer.

In an imprint lithography process, gas trapped between the substrate/imprinting stack and the template may escape through the polymerizable material, the substrate/imprinting stack, the template, or any combination thereof. The amount of gas that escapes through any medium may be influenced by the contact area between the trapped gas and the medium. The contact area between the trapped gas and the polymerizable material may be less than the contact area between the trapped gas and the substrate/imprinting stack and less than the contact area between the trapped gas and the template. For example, a thickness of the polymerizable material on a substrate/imprinting stack may be less than about 1 µm, or less than about 100 nm. In some cases, a polymerizable material may absorb enough gas to become saturated with the gas before imprinting, such that trapped gas is substantially unable to enter the polymerizable material. In contrast, the contact area between the trapped gas and the substrate or imprinting stack, or the contact area between the trapped gas and the template, may be relatively large.

In some cases, the substrate/imprinting stack or template may include a porous material defining a multiplicity of pores with an average pore size and pore density or relative porosity selected to facilitate diffusion of a gas into the substrate/imprinting stack or the template, respectively. In certain cases, the substrate/imprinting stack or template may include one or more layers or regions of a porous material designed to facilitate transport of gases trapped between the substrate/imprinting stack and the template in a direction away from the polymerizable material between the substrate/imprinting stack and substrate and toward the substrate/imprinting stack or the template, respectively.

A porous dielectric layer may be formed on a substrate such as a semiconductor device, an optical waveguide, and the like to provide an insulating layer to electrically isolate an active component. In some cases, a nanoimprint lithography template includes one or more porous dielectric layers formed on the substrate. The surface of the substrate on which the dielectric layer is formed may be substantially planar or may include features (e.g., nanopatterned features). The dielectric layer may be, for example, a gap fill layer, a passivation layer, an inter-metal dielectric film, a pre-metal dielectric film, a shallow trench isolation, or the like. The dielectric layer can be densified to improve properties of the dielectric layer (e.g., increasing stress stability or density while maintaining a porosity suitable to allow diffusion of helium gas through the dielectric layer). As used herein, "densification" of a silicon oxide layer generally refers to increasing the density of the layer or changing (e.g., increasing) the ratio of oxygen to silicon in the layer (e.g., from $SiO_{1.5}$ to $SiO_{1.9}$, from $Si_xN_yH_z$ to $SiO_2$, and the like). Improving the quality of a silicon oxide layer can include, for example, increasing the stress stability (e.g., of a nanoimprint lithography template), increasing the purity, and the like. The substrate on which the dielectric layer is formed may be a single-layer substrate or a multi-layer substrate. In an example, the substrate includes a silicon-containing layer, such as fused silica or a silicon wafer. In some cases, the substrate, or a top surface of the substrate, is substantially impermeable to water.

A dielectric layer can include two or more dielectric layers of the same or different material. For example, a first dielectric layer can be formed on a substrate, and a second dielectric layer can be formed on the first dielectric layer. The first dielectric layer may be treated before deposition of the second dielectric layer to enhance subsequent densification of the first dielectric layer, the second dielectric layer, or both. As described herein, a dielectric layer is formed of a material capable of undergoing bond restructuring, oxidation, or densification in the presence of an oxidant, a catalyst, or a reactant, such as water or oxygen. Examples of suitable materials for dielectric layers include oxides or nitrides of a metal or semiconductor. Examples of silicon-containing materials suitable for dielectric layers include silicon oxide, silicon nitride, and silicon-containing polymers such as polysilazane or spin-on-glass. Chemical reactions during densification can include reaction of oxygen or water with the silicon-containing material to form silicon-oxygen bonds. Based on the oxidant and the dielectric material undergoing oxidation, by-products may be absent or may include hydrogen gas and/or ammonia.

FIGS. 3A-3D illustrate a process of forming a first dielectric layer on a substrate, introducing water into pores in the first dielectric layer, forming a second dielectric layer on the water-containing first dielectric layer, and annealing the first dielectric layer and the second dielectric layers to simultaneously densify and/or improve the first and second dielectric layers. Densification may include wet or dry oxidation/annealing, with chemical reactions that include the incorporation of oxygen (e.g., formation of —Si—O— bonds) and the formation of hydrogen, ammonia, or the like, expelled as gaseous by-products.

Figure 3A:
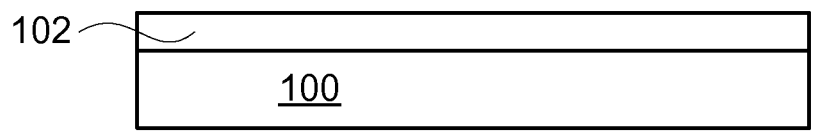
FIGS. 3A-3D illustrate a process of forming and densifying dielectric layers on a substrate.

FIG. 3A illustrates a side view of substrate 100 with first dielectric layer 102 formed on the substrate. First dielectric layer 102 may be formed on substrate 100 by a chemical vapor deposition (CVD) process (e.g., a plasma-enhanced CVD process) or a spin coating process known in the art. A thickness of first dielectric layer 102 is in a range between 1 µm and 10 µm. In an example, first dielectric layer 102 is formed by a PECVD process used to form a silicon oxide layer including $SiO_x$ on substrate 100, where $x \neq 2$ (i.e., the silicon oxide is not substantially pure silicon dioxide). In a PECVD process to form first dielectric layer 102, silicon-containing reaction gases can include $SiH_4$, TEOS, or other silicon-containing precursors. The reaction gas is oxidized by an oxidant under plasma. In one example, $SiH_4$ (flow rate 22 sccm) can be oxidized by $N_2O$ (flow rate 42 sccm) in a Plasma-Therm 700 VLR PECVD system (225° C., 300 mTorr, 50 W) to form first dielectric layer 102 on substrate 100. In other examples, first dielectric layer 102 is formed by a spin coating process to form a polysilazane layer or spin-on-glass layer on substrate 100. A polysilazane layer may be formed, for example, by spin coating SPINFIL 600 (available from AZ Electronic Materials) on substrate 100, and then oxidized (e.g., by steam annealing) to form a silicon oxide layer. U.S. Patent Application Publication No. 2007/0259106 to Shimizu et al., which is incorporated by reference herein, describes steam annealing of polysilazane compositions. A spin-on-glass (SOG) layer may be formed by spin coating a SOG material (available, for example, from Honeywell International, Inc.) on substrate 100. First dielectric layer 102 is a porous layer. As used herein, "porous layer" refers to a layer that is more porous than silicon dioxide ($SiO_2$).

After first dielectric layer 102 is formed on substrate 100, the first dielectric layer is contacted with a fluid (e.g., a vapor or liquid) including water to form water-containing first dielectric layer 104. Contacting the first dielectric layer with a fluid including water includes deliberate introduction of water into pores of the first dielectric layer rather than, for example, exposure of the first dielectric layer to ambient conditions. Examples of contacting first dielectric layer 102 with a water-containing fluid include chemical mechanical planarization (CMP) of the first dielectric layer, exposing the substrate or the first dielectric layer to water, an aqueous solution, or a vapor including water (e.g., steam), or dipping or soaking the substrate or the first dielectric layer in water, an aqueous solution, or a vapor including water (e.g., steam), and the like.

Figure 3B:
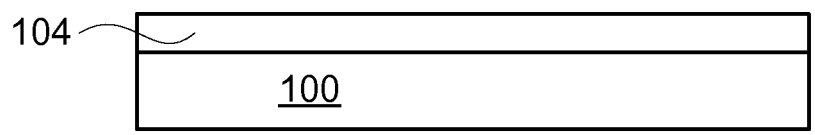
Figure 3C:
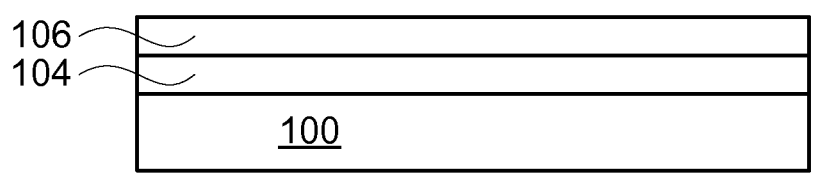

FIG. 3B illustrates water-containing first dielectric layer 104 on substrate 100. After water is introduced or incorporated into pores of first dielectric layer 102 to form water-containing first dielectric layer 104, second dielectric layer 106 is formed on the water-containing first dielectric layer, trapping moisture in the first dielectric layer. FIG. 3C shows second dielectric layer 106 on water-containing first dielectric layer 104. Water is not intentionally dissipated from the first dielectric layer 104 before the second dielectric layer 106 is formed on the first dielectric layer. That is, for example, first dielectric layer 104 may be exposed to ambient conditions but not annealed before second dielectric layer 106 is formed on the first dielectric layer. A thickness of second dielectric layer is in a range between 50 nm and 1 µm. Second dielectric layer 106 may be formed, for example, in a CVD process (e.g., a plasma-enhanced CVD process) or a spin coating process known in the art. In an example, second dielectric layer 106 is formed by a PECVD process used to form a silicon oxide layer including $SiO_x$ on porous, water-containing first dielectric layer 104, where $x \neq 2$. An example of a suitable PECVD process is described above with respect to first dielectric layer 102. In other examples, second dielectric layer 106 is formed by a spin coating process to form a polysilazane layer or spin-on-glass layer on first dielectric layer 104. A polysilazane layer may be formed, for example, by spin coating SPINFIL 600 (available from AZ Electronic Materials) on first dielectric layer 104, pre-baking (e.g., for several minutes at a temperature between 100° C. and 200° C.), and steam annealing as described below. A SOG layer may be formed by spin coating a SOG material (available, for example, from Honeywell International, Inc.) on water-containing first dielectric layer 104.

Figure 3D:
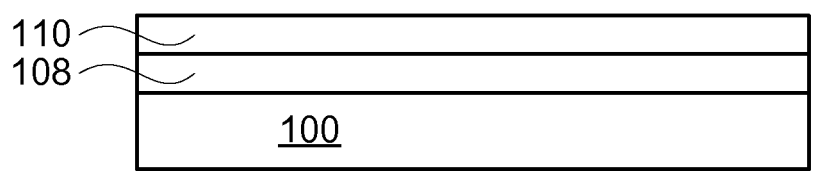

After second dielectric layer 106 is formed on porous, water-containing first dielectric layer 104, the first and second dielectric layers are steam annealed simultaneously in the presence of water or water and oxygen (e.g., oxygen in air) at a temperature of 600° C. or less (e.g., 550° C. or less) to form cured first dielectric layer 108 and cured second dielectric layer 110, as shown in FIG. 3D. In some cases, cured first dielectric layer 108 and cured second dielectric layer 110 have a higher density and/or a greater stress stability and/or a composition closer to $SiO_2$ or thermal oxide than first dielectric layer 102 and second dielectric layer 106, respectively.

During steam annealing of the assembly shown in FIG. 3C, a reactant or catalyst (e.g., water) enters second dielectric layer 106 from at least two sources and at least two directions: from the water-containing first dielectric layer 104 into the second dielectric layer 106, and from water in the environment (e.g., from steam surrounding the second dielectric layer) into the second dielectric layer. Thus, densification of second dielectric layer 106 to form cured second dielectric layer 110 may occur more quickly and more completely in this process than, for example, in a wet oxidation process in which a reactant or catalyst enters the layer to be densified from substantially one direction (e.g., from steam surrounding the second dielectric layer into the second dielectric layer). When a reactant or catalyst enters the layer to be annealed from substantially only one direction (e.g., through one surface or interface) densification first occurs at the surface through which the reactant or catalyst enters, forming a dense "skin" with a thickness on the order of a few nanometers. This dense "skin" slows the rate at which the reactant or catalyst enters the bulk of the dielectric layer, such that achieving a uniformly densified layer can be prohibitively time-consuming. In some cases, the resulting annealed layer may be inhomogeneous, or show a density gradient, with a lower density in the bulk than at the surface.

During a steam annealing process, a dielectric layer including $SiO_x$ with $x \neq 2$ (e.g., a PECVD layer or a SOG layer) may undergo some oxidation, with x approaching 2 as —Si—H and —Si—OH are converted to —Si—O—Si— bonds. At the same time, restructuring of silicon oxide in a dielectric layer may occur, such that bond stress in the layer is reduced or stress stability is increased. During a steam annealing process, a nitrogen-containing dielectric layer (e.g., a polysilazane layer) undergoes oxidation in the presence of water and oxygen to form silicon oxide or silicon dioxide in a process in which nitrogen is removed (e.g., in the form of ammonia) and —Si—O—Si— bonds are formed. Replacing nitrogen in polysilazane with oxygen to form silicon oxide provides pure and dense silica with a high cracking threshold (e.g., <1.0 µm) and strong adhesion to the substrate. In contrast, densifying a sol-gel spin-on-glass (SOG) by removing water from the SOG yields an incomplete silica with a low cracking threshold (e.g., <0.5 µm). After steam annealing or curing, the density of cured second dielectric layer 110 and/or cured first dielectric layer 108 may be comparable to the density of a thermal oxide. For example, a ratio of an etch rate of a cured dielectric layer to the etch rate thermal oxide, as described herein, may be in a range between 1:1 and 1.25:1 or in a range between 1:1 and 1.1:1. A ratio of the helium permeability of the cured dielectric layers to the helium permeability of thermal oxide is at least 2:1 or up to 3:1.

Figure 4:
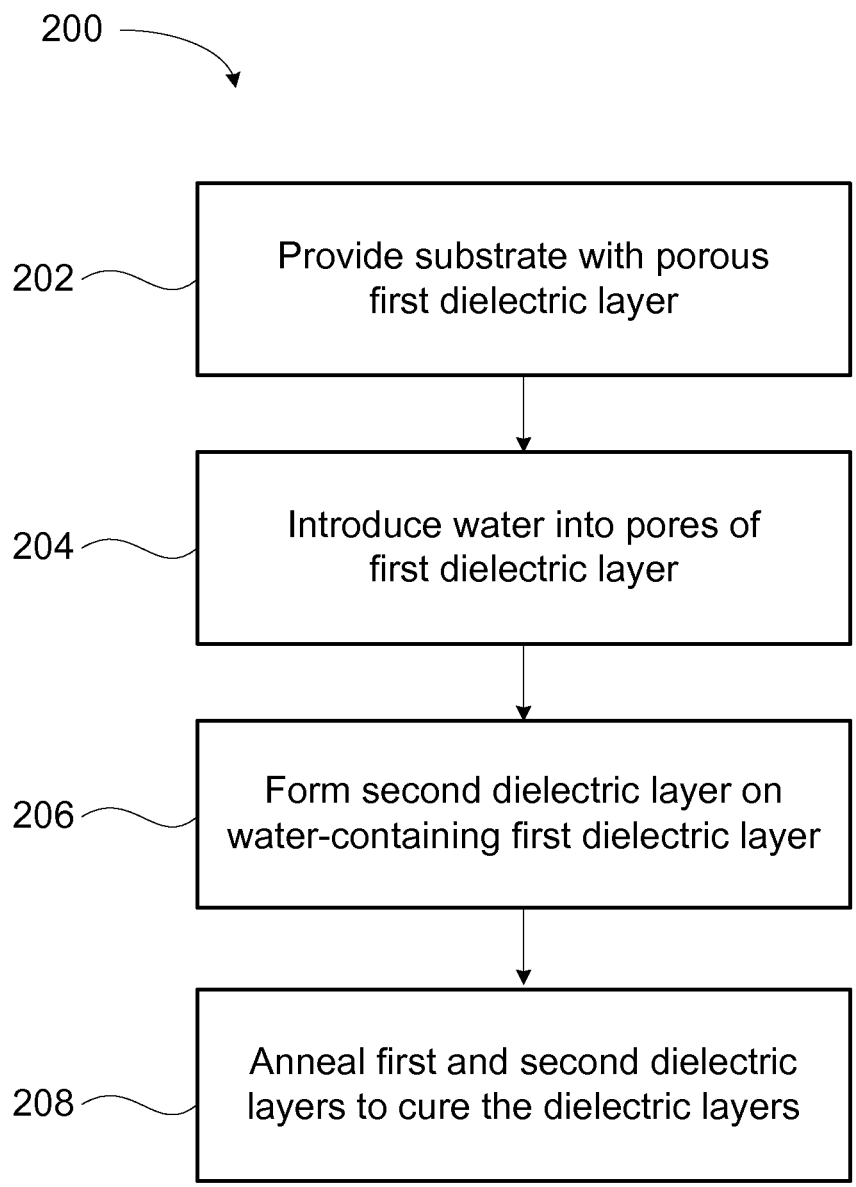
FIG. 4 is a flow chart describing steps in a densification process.

FIG. 4 is a flow chart showing process 200 to densify dielectric layers on a substrate. In 202, a substrate is provided with a porous first dielectric layer. In 204, water is introduced into pores in the first dielectric layer. In 206, a second dielectric layer is formed on the water-containing first dielectric layer formed in 204. The water-containing first dielectric layer and the second dielectric layer are simultaneously annealed in 208 at a temperature of 600° C. or less to increase an oxygen content and/or a density and/or the stress stability of the first and second dielectric layers, imparting and/or enhancing thermal-oxide-like properties to the cured first and second dielectric layers. In some cases, the process shown in FIG. 4 yields a second dielectric layer and/or a first dielectric layer with a density of at least 2.1 g/cm$^3$, at least 2.15 g/cm$^3$, or at least 2.18 g/cm$^3$, all comparable to the density of thermal oxide (2.2 g/cm$^3$).

In one embodiment, a second dielectric layer or cap layer on a porous template or photomask for use in nanoimprint lithography can be densified using a process described herein. U.S. Patent Application Publication Nos. 2004/0065976 to Sreenivasan et al. and 2004/0065252 to Sreenivasan et al and U.S. Pat. No. 6,936,194 to Watts, all of which are incorporated by reference herein, describe methods and apparatuses used in nanoimprint lithography. U.S. Patent Application Publication Nos. 2010/0104852 to Fletcher et al., 2010/0109201 to Fletcher et al., and 2009/0140458 to Xu et al., all of which are incorporated by reference herein, describe porous templates for use in nanoimprint lithography.

In nanoimprint lithography, templates or photomasks may be fabricated from fused silica. Fused silica provides high mechanical strength and UV transparency, which are both desirable for nanoimprint lithography templates. However, fused silica has relatively limited permeability to gases (e.g., helium), a property which can limit throughput in imprint lithography processes. Adding a porous layer to a fused silica template can increase throughput of a nanoimprint lithography process by enhancing diffusion of gases into the template. However, a porous layer on a surface of a fused silica template may not provide suitable mechanical stability, and thus may become damaged during an imprint lithography process.

Figure 5A:
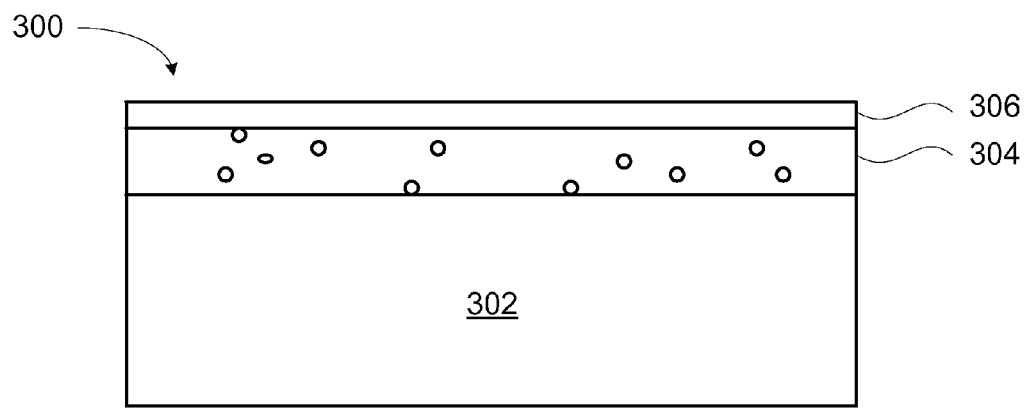
FIGS. 5A and 5B are side views of an imprint lithography template including a fused silica base layer, a first dielectric layer on the fused silica base layer, and a second dielectric layer on the first dielectric layer.
Figure 5B:
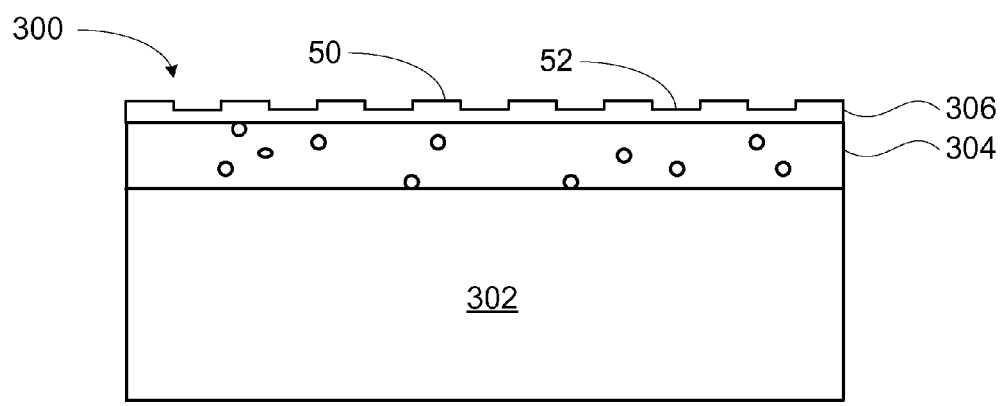

Increasing permeability of a nanoimprint lithography photomask while maintaining high mechanical strength may be achieved by forming a porous layer on a fused silica nanoimprint lithography photomask, and forming a thin, relatively dense layer on the porous layer. FIGS. 5A and 5B are side views of nanoimprint lithography templates 300 with fused silica base layer 302, porous or first dielectric layer 304, and cap or second dielectric layer 306. As shown in FIG. 5A, the imprinting surface of template 300 is substantially planar. As shown in FIG. 5B, template 300 includes a multiplicity of nanoscale protrusions 50 and recesses 52 (i.e., the template is nanopatterned).

Template 300 may be formed by a process including forming first dielectric or porous layer 304 on fused silica base layer 302, introducing water into pores of the porous layer, and forming second dielectric or cap layer 306 on the porous layer. Porous layer 304 and cap layer 306 may be formed of similar materials in similar processes as described with respect to first dielectric layer 102 (or 104) and second dielectric layer 106, respectively, shown in FIGS. 3A-3C. In some cases, porous layer 304 includes a low k dielectric material. Porous layer 304 and cap layer 306 can be steam annealed at a temperature of 600° C. or less to increase, for example, the density of the cap layer and the stress stability of the porous layer. After densification, cap layer 306 provides suitable mechanical strength for use as a nanoimprint lithography template. However, cap layer 306, together with porous layer 304 underneath the cap layer, allow more rapid diffusion of gases into the template than a fused silica template without a porous layer. An increase in helium permeability of cap layer 306, together with a density comparable to that of thermal oxide, provides desirable mechanical characteristics and allows rapid diffusion of helium through the first dielectric layer and into porous layer 304, thereby facilitating more rapid filling of features of a patterned imprint lithography template with an imprint resist in a helium environment.

EXAMPLES

Comparative Example

A porous silicon oxide layer ($SiO_x$, with $x \neq 2$) with a thickness of about 4 μm was formed on a silicon substrate with a PECVD process, in which $SiH_4$ (flow rate 22 sccm) was oxidized by $N_2O$ (flow rate 42 sccm) in a Plasma-Therm 700 VLR PECVD system (225° C., 300 mTorr, 50 W). A second dielectric layer was then formed by spin coating a layer of polysilazane (SPINFIL 600) with a thickness of about 0.5 μm on the porous silicon oxide layer. After the second dielectric layer was dried or pre-baked, the substrate/dielectric layer assembly was steam annealed at 550° C. in the presence of $H_2O$ and $O_2$.

Example

A porous silicon oxide layer ($SiO_x$, with $x \neq 2$) with a thickness of about 4 μm was formed on a silicon substrate with a PECVD process similar to that described above for the Comparative Example. Chemical mechanical planarization (CMP) was used to polish the surface of the silicon oxide layer. The CMP process was performed with an IPEC/Westech Model 373M CMP System, using a Cabot Semiconductor Semi Sperse 12E slurry (polish pressure=2 psi, back pressure=1.5 psi, plattern RMP=90, head RPM=85, head size=4", polish time=1 min). Water was introduced into pores in the porous silicon oxide layer during the CMP process. The second dielectric layer was then formed by spin coating a layer of polysilazane (SPINFIL 600) with a thickness of about 0.5 μm on the water-containing porous silicon oxide layer in a process similar to that described above for the Comparative Example. The water-containing porous silicon oxide layer was not annealed before the second dielectric layer was formed on the substrate. After the second dielectric layer was dried or pre-baked, the substrate/dielectric layer assembly was steam annealed at 550° C. in a process similar to that described above for the Comparative Example.

Properties of the Example and the Comparative Example were assessed, and etch rates of the first and second dielectric layers were compared to the etch rate of a thermal oxide. Table I lists properties of the steam-annealed multi-layer substrate formed in the Example and the Comparative Example.

TABLE I

Properties of steam-annealed dielectric layers.

| Property | Comparative Example | Example |
|---|---|---|
| Film Stress/Curvature | Tensile after annealed at 550° C., and cracked after annealed at 600° C. | Compressive after annealed at 550° C. or 600° C., with no cracking up to 600° C. |
| Ratio of etch rate of second dielectric layer to etch rate of thermal oxide at 550° C. | 1.5:1 | 1.1:1 |
| Ratio of etch rate of first dielectric layer to etch rate of thermal oxide at 550° C. | >69:1 | ~43:1 |
| Helium fill time during nanoimprinting test (sec) | 1 | 2.1 |

The Comparative Example, with no water introduced into the first dielectric layer during processing (i.e., no CMP), showed tensile film stress at 550° C. Cracking of the second dielectric layer was observed at 600° C. The Example, with water introduced into the first dielectric layer during processing (i.e., CMP of the first dielectric layer) showed compressive film stress at 550° C. and 600° C., with no cracking up to 600° C. A dielectric layer with compressive stress may be more robust and therefore more desirable than a dielectric layer with tensile stress.

Etch rates of the first dielectric layer and the second dielectric layer of the Example and the Comparative Example were assessed at room temperature with 20:1 Buffered Oxide Etch (BOE) with surfactant (available from J.T. Baker) as the etchant. For the Example and the Comparative Example, the ratio of the etch rate of the first dielectric layer annealed at 550° C. to the etch rate of a thermal oxide and the ratio of the etch rate of the second dielectric layer annealed at 550° C. to the etch rate of a thermal oxide are shown in Table I. As seen in Table I, the etch rate of the second dielectric layer (SPINFIL 600) of the Example is only 10% greater than the etch rate of the thermal oxide. This enhanced densification yields a high quality silicon oxide layer with properties comparable to those of thermal oxide, but achieved at a much lower temperature (e.g., 550° C.) than temperatures required for thermal oxidation (e.g., 1000° C.). The etch rate of the second dielectric layer (SPINFIL 600) of the Comparative Example is 50% greater than the etch rate of the thermal oxide.

The etch rate of the first dielectric layer (PECVD silicon oxide) of the Example is about 45 times the etch rate of the thermal oxide, and the etch rate of the first dielectric layer (PECVD silicon oxide) of the Comparative Example is about 70 times greater than the etch rate of the thermal oxide. Thus, both the first (PECVD) and second (SPINFIL 600) dielectric layers of the Example are more dense than the first (PECVD) and second (SPINFIL 600) dielectric layers of the Comparative Example, respectively. The presence of water in the water-containing first dielectric layer (e.g., the presence of moisture trapped in the first dielectric layer) has been shown to enhance densification of the first and second dielectric layers during a steam annealing process, resulting in a second dielectric layer (SPINFIL 600) with an etch rate surprisingly similar to that of thermal oxide, yet achieved at much lower temperatures.

As an indicator of porosity, Table I shows that the helium fill time of the Example was over twice the helium fill time of the Comparative Example. The helium fill time corresponds to the time required for drops of a polymerizable material (e.g., an imprint resist) placed on the second dielectric layer in a helium environment to fill interstitial regions between the drops in an imprinting process. Filling of interstitial regions by the imprint resist corresponds to diffusion of helium in the interstitial regions into, for example, the porous layer (i.e., into the first dielectric layer via the second dielectric layer). Thus, the helium fill times shown in Table I indicate the multi-layer substrate of the Example is less porous (more dense) than the multi-layer substrate of the Comparative Example. Helium fill time is described in U.S. Patent Application Publication No. 2010/0104852, which shows images of drops of imprint resist in a helium environment taken through a nanoimprint lithography template.

The helium fill time for the Example during a nanoimprinting test was 2.1 seconds, compared to a helium fill time of about 5 to 6 seconds for a thermal oxide second dielectric layer. Thus, the Example shows mechanical strength comparable to thermal oxide and gas diffusion properties on the order of 2 to 3 times better than thermal oxide, indicating a favorable and unexpected combination of strength and porosity. The helium fill time for the Comparative Example is 1 second, but this increased porosity is accompanied with undesirable tensile stress and cracking when annealed at 600° C.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. A method comprising:
providing a substrate with a first dielectric layer, wherein the first dielectric layer defines a multiplicity of water-containing pores and wherein providing the substrate with the first dielectric layer further comprises forming the first dielectric layer on the substrate and contacting the first dielectric layer with a fluid comprising water;
providing a second dielectric layer on the water-containing first dielectric layer; and
steam annealing the first and second dielectric layers at a temperature of 600° C. or less.

2. The method of claim 1, wherein the substrate is impermeable to water.

3. The method of claim 1, wherein steam annealing the first and second dielectric layers at a temperature of 600° C. or less increases the density of the first dielectric layer and the second dielectric layer.

4. The method of claim 1, wherein before steam annealing, the first dielectric layer comprises $SiO_x$, wherein $x \neq 2$.

5. The method of claim 1, wherein the first dielectric layer comprises a silicon-containing polymer.

6. The method of claim 1, wherein providing the second dielectric layer on the first dielectric layer comprises a chemical vapor deposition process or a spin coating process.

7. The method of claim 6, wherein providing the second dielectric layer on the first dielectric layer comprises a spin coating process, and the spin coating process comprises spin coating a polysilazane film or a spin-on-glass film on the water-containing first dielectric layer.

8. The method of claim 1, wherein a ratio of an etch rate of the second dielectric layer after annealing to an etch rate of thermal oxide is between 1:1 and 1.25:1.

9. The method of claim 1, wherein forming the first dielectric layer on the substrate comprises a spin coating process or a chemical vapor deposition process.

10. The method of claim 1, wherein the fluid is a vapor or a liquid.

11. The method of claim 1, wherein contacting the first dielectric layer with a fluid comprising water comprises chemical mechanical planarization of the first dielectric layer.

12. The method of claim 1, wherein contacting the first dielectric layer with a fluid comprising water comprises contacting the first dielectric layer with an aqueous solution or water.

13. A device fabricated by the method of claim 1.

14. A method of fabricating an imprint lithography template, the method comprising:
providing a fused silica substrate with a porous layer, wherein the porous layer defines a multiplicity of water-containing pores and wherein providing the fused silica substrate with the porous layer further comprises forming the porous layer on the fused silica substrate and contacting the porous layer with a fluid comprising water;
providing a cap layer on the water-containing porous layer; and
steam annealing the porous layer and the cap layer at a temperature of 600° C. or less to increase a density of the cap layer.

15. The method of claim 14, wherein providing the cap layer on the water-containing porous layer comprises spin-coating a polymerizable material on the water-containing porous layer.

16. The method of claim 15, further comprising patterning the polymerizable material to form a patterned cap layer on the water-containing porous layer.

17. The method of claim 15, further comprising pre-baking the polymerizable material before steam annealing the porous layer and the cap layer.

18. An imprint lithography template fabricated by the method of claim 14.

* * * * *